US011787092B2

(12) United States Patent
Sato

(10) Patent No.: US 11,787,092 B2
(45) Date of Patent: Oct. 17, 2023

(54) MOLDING METHOD, MOLDING APPARATUS, MOLDING SYSTEM, AND ARTICLE MANUFACTURING METHOD

(71) Applicant: CANON KABUSHIKI KAISHA, Tokyo (JP)

(72) Inventor: Hiroshi Sato, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 46 days.

(21) Appl. No.: 17/487,307

(22) Filed: Sep. 28, 2021

(65) Prior Publication Data

US 2022/0126488 A1    Apr. 28, 2022

(30) Foreign Application Priority Data

Oct. 28, 2020    (JP) ................................. 2020-180839

(51) Int. Cl.
    *C23F 1/00*    (2006.01)
    *B29C 43/58*   (2006.01)
    *B29C 43/20*   (2006.01)

(52) U.S. Cl.
    CPC ............ *B29C 43/58* (2013.01); *B29C 43/203* (2013.01); *B29C 2043/5825* (2013.01)

(58) Field of Classification Search
    None
    See application file for complete search history.

(56) References Cited

U.S. PATENT DOCUMENTS

| 8,394,282 B2 | 3/2013 | Panga |
| 9,415,418 B2 | 8/2016 | Sreenivasan |
| 2010/0012622 A1* | 1/2010 | Panga ................. G03F 7/70483 216/52 |

FOREIGN PATENT DOCUMENTS

JP    1185941 B2    11/2008

* cited by examiner

*Primary Examiner* — Robert J Grun
(74) *Attorney, Agent, or Firm* — ROSSI, KIMMS & McDOWELL LLP

(57) ABSTRACT

The present invention provides a molding method of molding, using a mold, an uncured composition arranged on a substrate as a film continuously covering a surface of the substrate, including obtaining unevenness information concerning an unevenness of a surface of an uncured first composition arranged as the film on the substrate, arranging a droplet of an uncured second composition on a concave portion of the surface of the first composition based on the unevenness information obtained in the obtaining, and after the arranging the droplet is performed, molding a composition including the film of the first composition and the droplet of the second composition by the mold.

20 Claims, 11 Drawing Sheets

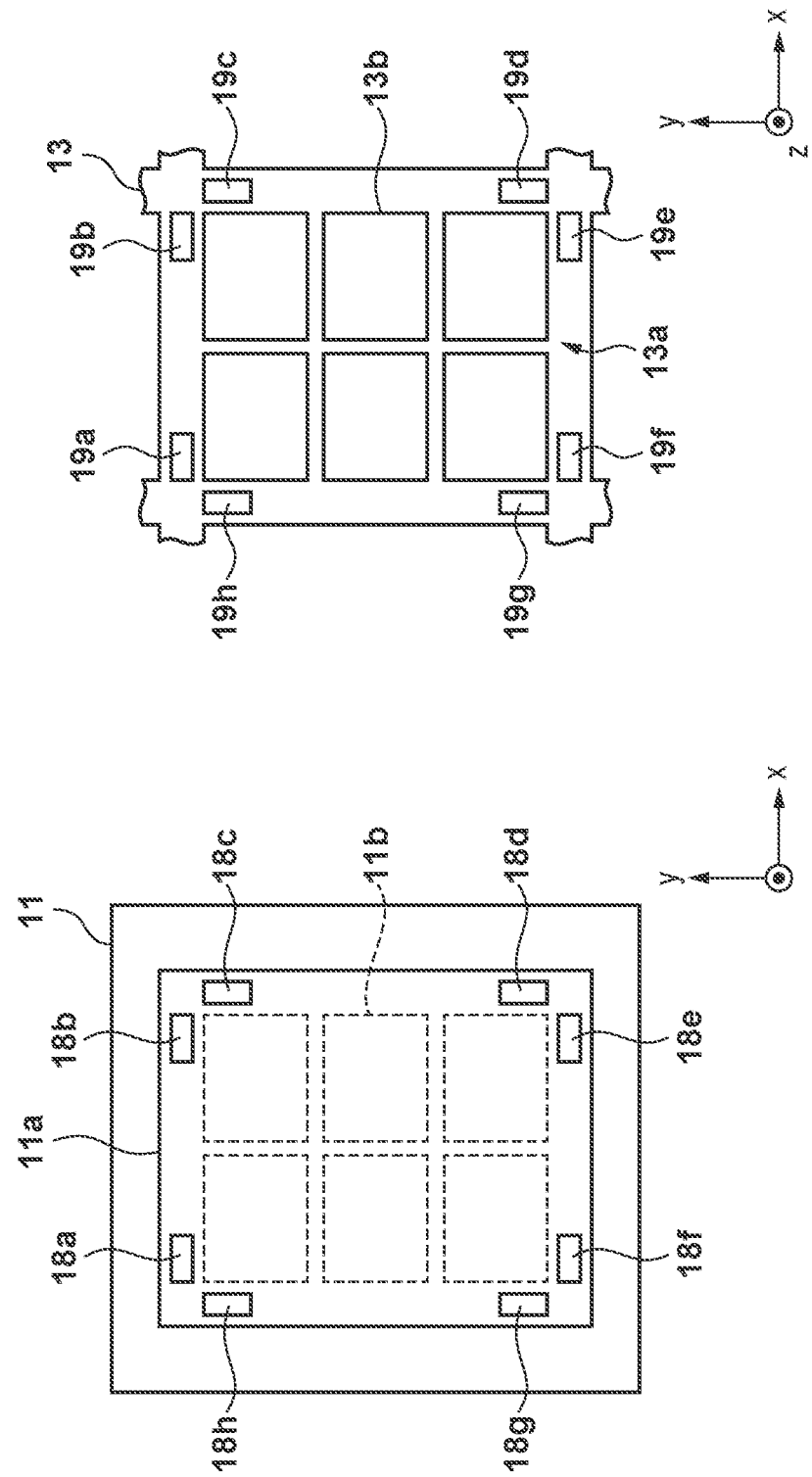

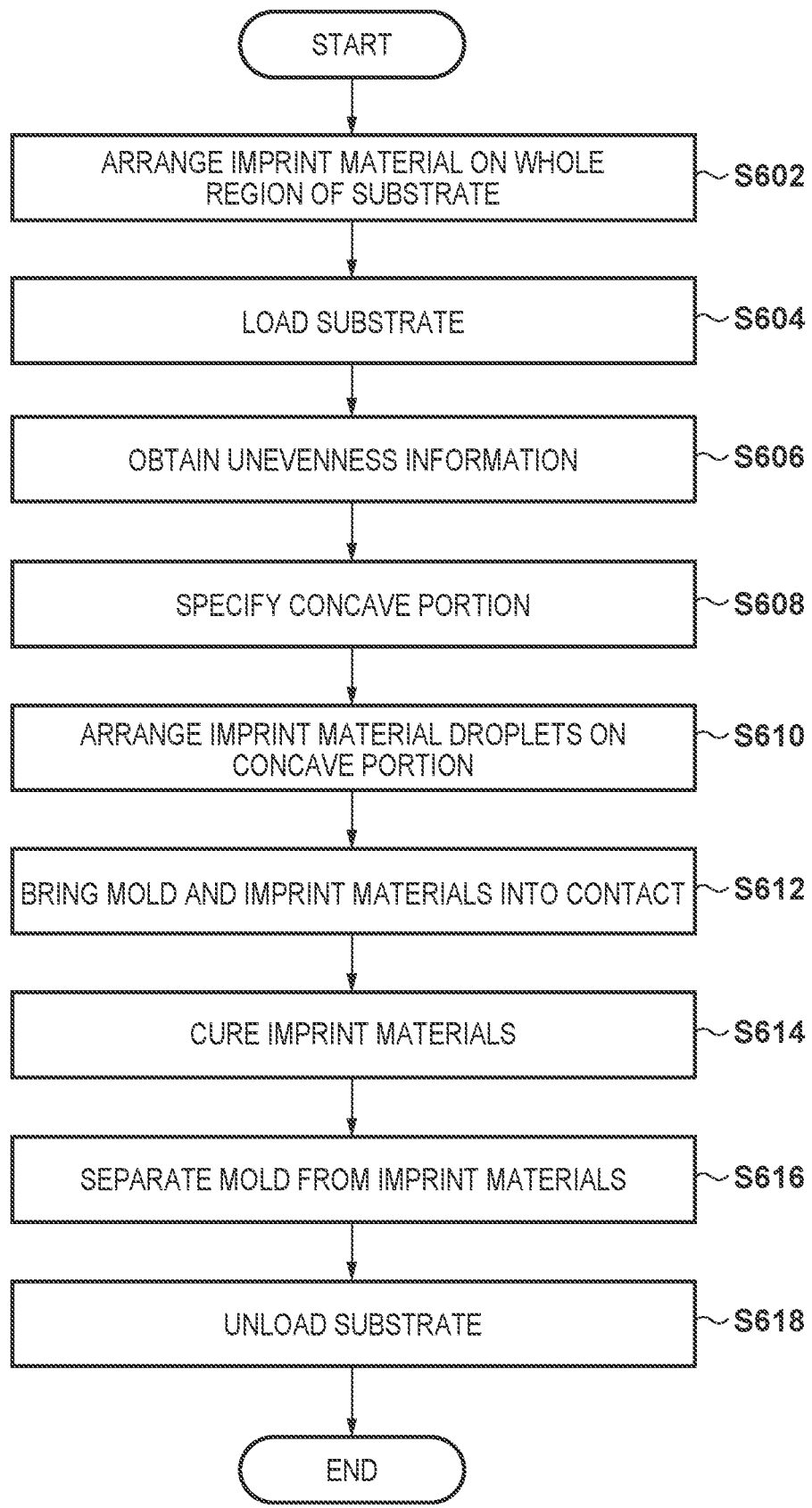

MOLDING METHOD, MOLDING APPARATUS, MOLDING SYSTEM, AND ARTICLE MANUFACTURING METHOD

BACKGROUND OF THE INVENTION

Field of the Invention

The present invention relates to a molding method, a molding apparatus, a molding system, and an article manufacturing method.

Description of the Related Art

An imprint technique is a technique for enabling transfer of a fine pattern of nanoscale order, and has been proposed in Japanese Patent No. 4185941 as one of mass-production lithography techniques for a device such as a semiconductor device or a magnetic storage device. An imprint apparatus using the imprint technique cures an imprint material in a state in which a mold having a pattern surface on which a pattern is formed is in contact with the imprint material on a substrate. Then, the mold is separated from the cured imprint material on the substrate, thereby forming the pattern of the imprint material on the substrate.

In general, an imprint apparatus employs a die-by-die alignment method as an alignment method between a mold (pattern surface) and a substrate (shot region). The die-by-die alignment method is an alignment method of optically detecting marks provided on a mold and marks provided on a substrate for each shot region of a substrate and correcting the deviation in the positional relationship between the mold and the substrate. In addition, to make the shape of the pattern surface of the mold match the shape of each shot region of the substrate, a plurality of marks provided on the periphery of the pattern surface and a plurality of marks provided on the periphery of a shot region are detected, and a shape deviation (a shift, a magnification, or the like) between these is also obtained.

On the other hand, an imprint material used by the imprint apparatus is conventionally highly volatile, and decreases or disappears in a short time when supplied to (arranged on) a substrate. Hence, in many cases, a method of supplying an imprint material onto a substrate immediately before pressing is used. In this method, however, since the imprint material is supplied for each shot region of the substrate, the productivity of the imprint apparatus lowers. In recent years, an imprint material whose volatility is low has been developed, and a method of supplying the imprint material to the whole region (all shot regions) of a substrate all at once in advance has started to be examined.

However, if the imprint material is supplied all at once to the whole region of the substrate in advance, an unevenness is formed on the surface of the imprint material supplied onto the substrate because of an unevenness (For example, a mark or a pattern) on the substrate. The unevenness formed on the surface of the imprint material on the substrate captures (traps) a gas between a mold and the imprint material when the mold and the imprint material are brought into contact, and therefore becomes a factor for impeding filling of the imprint material into the pattern of the mold.

SUMMARY OF THE INVENTION

The present invention provides a technique advantageous for filling a mold with an imprint material.

According to one aspect of the present invention, there is provided a molding method of molding, using a mold, an uncured composition arranged on a substrate as a film continuously covering a surface of the substrate, including obtaining unevenness information concerning an unevenness of a surface of an uncured first composition arranged as the film on the substrate, arranging a droplet of an uncured second composition on a concave portion of the surface of the first composition based on the unevenness information obtained in the obtaining, and after the arranging the droplet is performed, molding a composition including the film of the first composition and the droplet of the second composition by the mold.

Further aspects of the present invention will become apparent from the following description of exemplary embodiments with reference to the attached drawings.

BRIEF DESCRIPTION OF THE DRAWINGS

FIGS. 3A and 3B are views illustrating examples of mold-side marks provided on a mold and substrate-side marks provided on a substrate.

FIG. 6 is a flowchart for describing imprint processing according to the embodiment.

DESCRIPTION OF THE EMBODIMENTS

Figure 1:
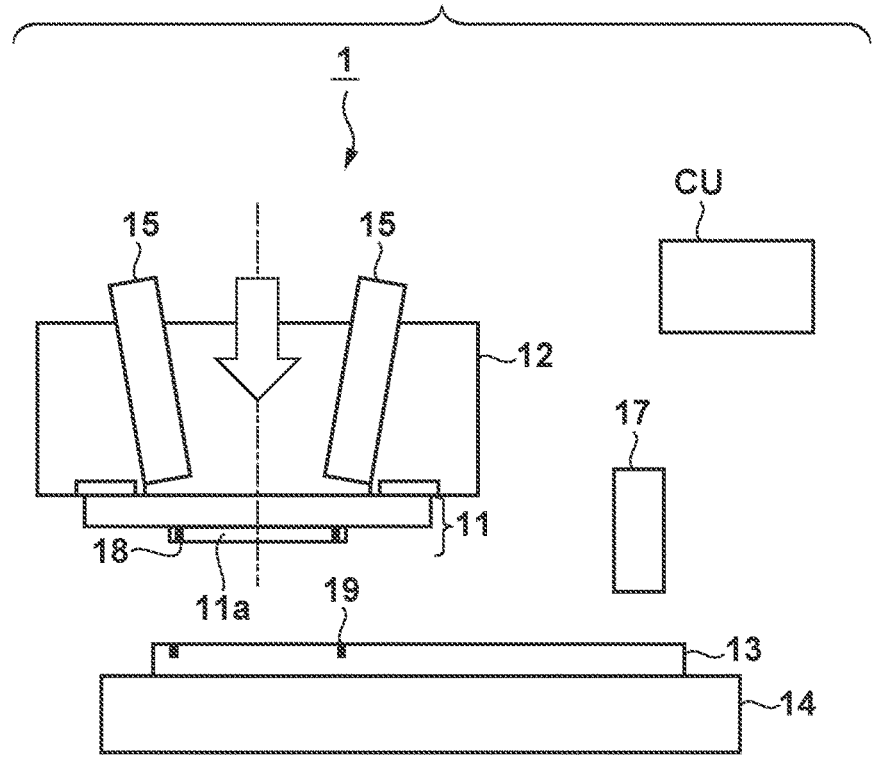
FIG. 1 is a schematic view illustrating configurations of an imprint apparatus according to an aspect of the present invention.

Hereinafter, embodiments will be described in detail with reference to the accompanying drawings. It should be noted that the following embodiments are not intended to limit the scope of the appended claims. In the embodiments, a plurality of features are described. However, not all the plurality of features are necessarily essential to the present invention, and the plurality of features may arbitrarily be combined. In addition, the same reference numerals denote the same or similar parts in the accompanying drawings, and a repetitive description thereof will be omitted.

FIG. 1 is a schematic view illustrating configurations of an imprint apparatus 1 according to an aspect of the present invention. The imprint apparatus 1 is a lithography apparatus that is employed in a lithography step as a manufacturing step of a semiconductor device, a liquid crystal display element, a magnetic storage medium, or the like and forms a pattern on a substrate. The imprint apparatus 1 functions as a molding apparatus configured to mold, using a mold, an imprint material that is an uncured composition arranged on a substrate as a film continuously covering the surface (for example, a region including a plurality of shot regions, or the whole region) of the substrate. In this embodiment, the imprint apparatus 1 brings an imprint material arranged on (supplied to) a substrate into contact with a mold and gives curing energy to the imprint material, thereby forming a pattern of a cured product to which the pattern of the mold is transferred. Note that the mold is also called a mold, a template, or a master.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In the specification and the accompanying drawings, directions will be indicated on an XYZ coordinate system in which directions parallel to the surface of a substrate 13 are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that is specified based on coordinates on the X-, Y-, and Z-axes, and a posture is information that is specified by values on the θX-, θY-, and θZ-axes. Positioning means controlling the position and/or the posture. Alignment includes controlling the position and the posture of at least one of the substrate and the mold.

The imprint apparatus 1 employs a photo-curing method as a curing method of an imprint material in this embodiment, but may employ a heat curing method or the like. The imprint apparatus 1 includes a mold holding unit 12 that holds a mold 11, a substrate holding unit 14 that holds a substrate 13, a measuring unit 15, a shape correction unit 16, a supply unit 17, and a control unit CU. Also, the imprint apparatus 1 includes a bridge surface plate configured to hold the mold holding unit 12 or a base surface plate configured to hold the substrate holding unit 14.

The mold 11 includes a pattern surface 11a on which a pattern (uneven structure) to be transferred to (an imprint material on) the substrate 13 is formed. The mold 11 is made of a material (for example, quartz) that passes light (for example, UV rays) used to cure the imprint material on the substrate. Also, the mold 11, more specifically, the pattern surface 11a of the mold 11 is provided with a mold-side mark 18.

The mold holding unit 12 is a holding mechanism that holds the mold 11. The mold holding unit 12 includes, for example, a mold chuck that vacuum-chucks or electrostatically chucks the mold 11, a mold stage on which the mold chuck is placed, and a mold driving system that drives (moves) the mold stage. The mold driving system drives the mold stage (that is, the mold 11) at least in the Z direction (the direction (pressing direction) in which the mold 11 is driven when bringing (pressing) the mold 11 into contact with (on) the imprint material on the substrate). In addition, the mold driving system may have a function of driving the mold stage not only in the Z direction but also in the X direction, the Y direction, and the θZ direction.

The substrate 13 is a substrate to which the pattern of the mold 11 is transferred. An imprint material is supplied to (arranged on) the substrate 13. Note that various kinds of materials necessary for manufacturing a device may be constituted on the substrate 13. In addition, each of a plurality of shot regions of the substrate 13 is provided with a substrate-side mark 19.

The substrate holding unit 14 is a holding mechanism that holds the substrate 13. The substrate holding unit 14 includes, for example, a substrate chuck that vacuum-chucks or electrostatically chucks the substrate 13, a substrate stage on which the substrate chuck is placed, and a substrate driving system that drives (moves) the substrate stage. The substrate driving system drives the substrate stage (that is, the substrate 13) at least in the X direction and the Y direction (directions orthogonal to the pressing direction of the mold 11). In addition, the substrate driving system may have a function of driving the substrate stage not only in the X direction and the Y direction but also in the Z direction and the θZ direction.

The measuring unit 15 includes a scope that optically detects (observes) the mold-side marks 18 provided on the mold 11 and the substrate-side marks 19 provided on each of the plurality of shot regions of the substrate 13. The measuring unit 15 obtains position information by measuring the relative positions (misalignment) between the mold 11 and the substrate 13 based on the detection result of the scope. However, the measuring unit 15 need only be able to measure the relative positions of the mold-side mark 18 and the substrate-side mark 19. Hence, the measuring unit 15 may include a scope including an optical system configured to simultaneously capture two marks or may include a scope configured to detect a signal reflecting the relative position between two marks such as an interference signal or moire between two marks. Also, the measuring unit 15 may be unable to simultaneously detect the mold-side mark 18 and the substrate-side mark 19. For example, the measuring unit 15 may measure the relative position between the mold-side mark 18 and the substrate-side mark 19 by obtaining the position of each of the mold-side mark 18 and the substrate-side mark 19 with respect to a reference position arranged inside. In this embodiment, to improve the productivity of the imprint apparatus 1, the mold-side mark 18 and the substrate-side mark 19 are detected, and the mold 11 and the substrate 13 are aligned based on the relative position between these in parallel to filling of the imprint material into the pattern of the mold 11.

Figure 2:
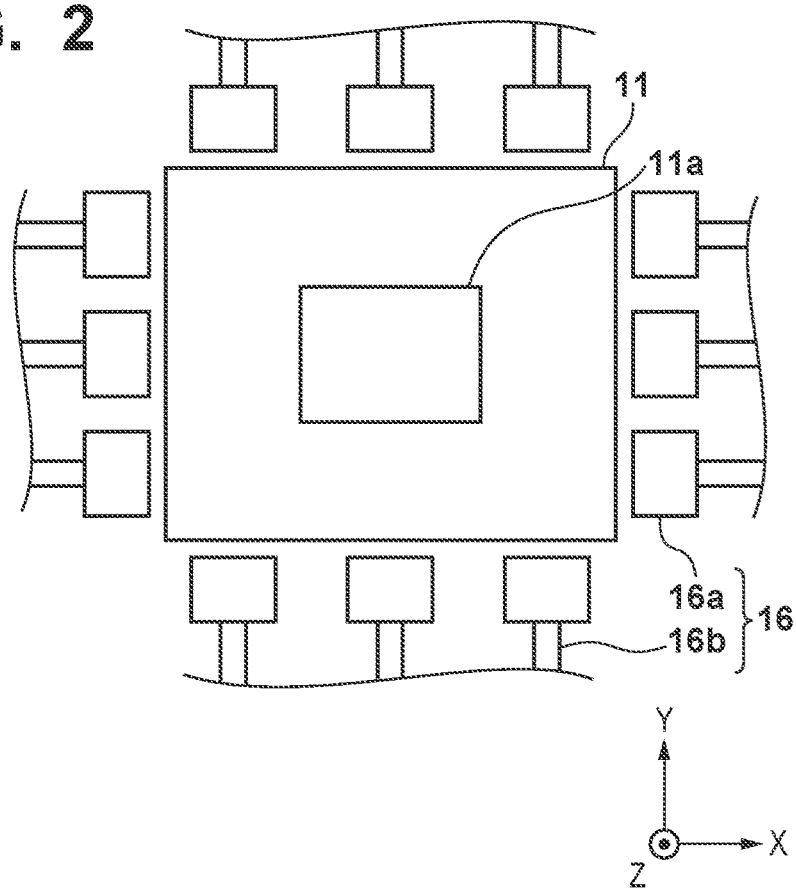
FIG. 2 is a view illustrating an example of the configuration of the shape correction unit of the imprint apparatus shown in FIG. 1.

To make the shape of the pattern surface 11a of the mold 11 match the shape of a shot region of the substrate 13, the shape correction unit 16 deforms the pattern surface 11a (corrects the shape of the pattern surface 11a) by applying a force to the mold 11 in a direction parallel to the pattern surface 11a. For example, as shown in FIG. 2, the shape correction unit 16 includes an attraction unit 16a that attracts a side surface of the mold 11, and an actuator 16b that drives the attraction unit 16a in a direction to approach the side surface of the mold 11 and a direction to separate from the side surface of the pattern surface 11a. Note that the attraction unit 16a need not always have the function of attracting the side surface of the mold 11 and, for example, may be replaced with a contact member than contacts the side surface of the mold 11. Also, the shape correction unit 16 may deform the pattern surface 11a by applying heat to the mold 11 and controlling the temperature of the mold 11, instead of applying a force to the mold 11.

The supply unit 17 is formed by a dispenser including a nozzle that drops an uncured imprint material onto the substrate, and has a function of arranging (supplying) a droplet of the imprint material onto the substrate. The supply unit 17 can employ, for example, a piezo-jet method or a micro-solenoid method and arrange an imprint material droplet of a very small capacity of about 1 pL (picoliter) on the substrate.

The control unit CU is formed by an information processing apparatus (computer) including a CPU, a memory, and the like and controls the entire imprint apparatus 1 in accordance with a program stored in a storage unit. The control unit CU controls each unit of the imprint apparatus 1 and controls processing of making the mold 11 and the imprint material on the substrate into contact with each other and forming a film of the imprint material between the mold 11 and the substrate 13. In this embodiment, the processing of forming a film of the imprint material is imprint processing of forming a pattern of the imprint material in each of the plurality of shot regions of the substrate 13. For example, when performing imprint processing, the control unit CU aligns the mold 11 and the substrate 13 based on the measurement result of the measuring unit 15. Also, when performing imprint processing, the control unit CU controls the deformation amount of the pattern surface 11a of the mold 11 by the shape correction unit 16.

The mold-side mark 18 and the substrate-side mark 19, which function as alignment marks to be used for alignment between the mold 11 and the substrate 13, will be described with reference to FIGS. 3A and 3B. In this embodiment, six chip regions are arranged in one shot region of the substrate 13.

FIG. 3A shows mold-side marks 18a to 18h provided on the pattern surface 11a of the mold 11, more specifically, at the four corners of the pattern surface 11a. Referring to FIG. 3A, the mold-side marks 18a, 18b, 18e, and 18f having a longitudinal direction in the horizontal direction are marks having a measurement direction in the X direction. On the other hand, the mold-side marks 18c, 18d, 18g, and 18h having a longitudinal direction in the vertical direction are marks having a measurement direction in the Y direction. Also, in FIG. 3A, regions surrounded by dotted lines indicate pattern regions 11b in which patterns to be transferred to the six chip regions on the substrate are formed.

FIG. 3B shows substrate-side marks 19a to 19h provided on the periphery of one shot region 13a of the substrate 13, more specifically, at the four corners of the shot region 13a. Referring to FIG. 3B, the substrate-side marks 19a, 19b, 19e, and 19f having a longitudinal direction in the horizontal direction are marks having a measurement direction in the X direction. On the other hand, the substrate-side marks 19c, 19d, 19g, and 19h having a longitudinal direction in the vertical direction are marks having a measurement direction in the Y direction. Also, in FIG. 3B, regions surrounded by solid lines inside the shot region 13a indicate chip regions 13b.

When performing imprint processing, that is, when bringing the mold 11 into contact with the imprint material on the substrate, each of the mold-side marks 18a to 18h provided on the mold 11 approaches a corresponding one of the substrate-side marks 19a to 19h provided on the substrate 13. Hence, when the mold-side mark 18 and the substrate-side mark 19 are detected by the measuring unit 15, the position and shape of the pattern surface 11a of the mold 11 and the position and shape of the shot region 13a of the substrate 13 can be compared. If a difference (deviation) is generated between the position and shape of the pattern surface 11a of the mold 11 and the position and shape of the shot region 13a of the substrate 13, the overlay accuracy lowers, resulting in a pattern transfer failure (product defect).

As a detailed example of imprint processing, how the mold-side mark 18 provided on the mold 11 is transferred to the imprint material on the substrate (the imprint material on the substrate-side mark 19) will be described here with reference to FIGS. 4A to 4D.

Figure 4A:
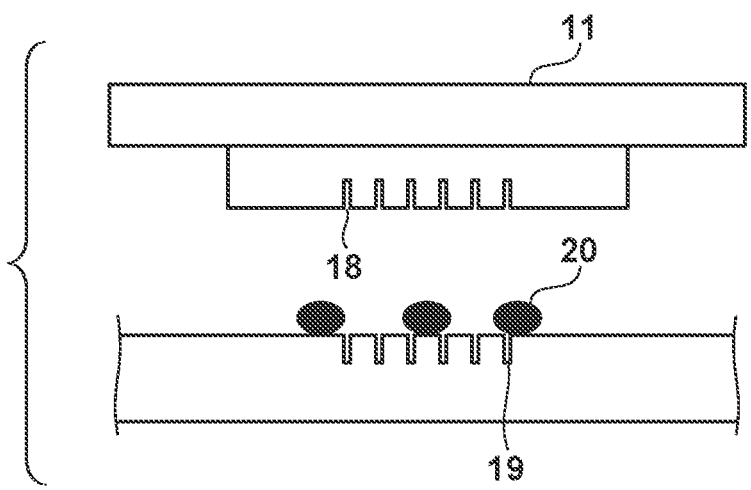
FIGS. 4A to 4D are views for describing imprint processing in detail.

First, as shown in FIG. 4A, an imprint material 20 is arranged on the shot region of the substrate 13 before the start of pressing. The imprint material generally used by the imprint apparatus 1 is highly volatile. Hence, the imprint material 20 is preferably arranged on the substrate immediately before pressing. Note that FIG. 4A shows an example in which, for example, the imprint material 20 is arranged as droplets on the substrate via the supply unit 17 including a dispenser.

Figure 4B:
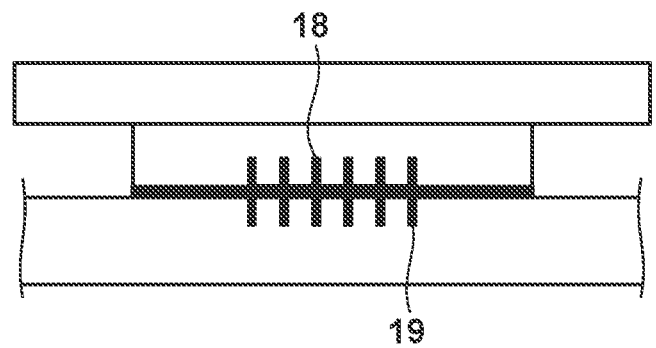

Next, as shown in FIG. 4B, the mold 11 (pattern surface 11a) is brought into contact with the imprint material 20 on the substrate, and the pattern (uneven structure) of the mold 11 is filled with the imprint material 20. In this state, since visible light can pass through the imprint material 20 on the substrate, the substrate-side mark 19 provided on the substrate 13 can be measured by the measuring unit 15. Also, to pass light, for example, UV rays for curing the imprint material 20 on the substrate, the mold 11 is made of a transparent material such as quartz. Hence, the refractive index difference between the mold 11 and the imprint material 20 is small, and it may be impossible to measure the mold-side mark 18 only by forming the mold-side mark 18 as an uneven structure. In such a case, the mold-side marks 18 is made of a substance having a refractive index or transmittance different from the material of the mold 11, or the refractive index of the mold-side mark 18 is changed by ion irradiation or the like. This makes it possible to reliably measure the mold-side mark 18 even in the state shown in FIG. 4B.

Figure 4C:
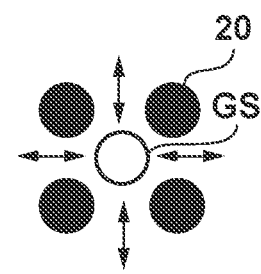

FIG. 4C shows the state in FIG. 4B viewed from above the substrate 13. As described above, when the imprint material 20 is arranged as droplets on the substrate, gaps are generated between the droplets of the imprint material 20 in the early stage of pressing. As the pressing progresses, and the imprint material 20 spreads, the gaps between the droplets of the imprint material 20 are filled. At this time, a gas GS that exists between the mold 11 and the imprint material 20 on the substrate is pushed to the outside via the gaps. It is therefore possible to minimize the gas GS captured between the substrate 13 (imprint material 20) and the mold 11 and suppress the influence on the filling of the imprint material 20 into the pattern of the mold 11. Note that in parallel to the filling of the imprint material 20 into the pattern of the mold 11, the relative position between the mold-side mark 18 and the substrate-side mark 19 is measured, and alignment between the mold 11 and the substrate 13 and shape correction of the pattern surface 11a of the mold 11 are performed.

Figure 4D:
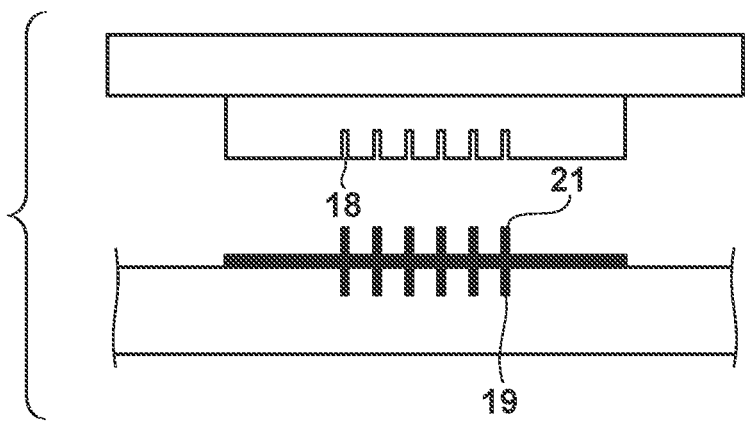

FIG. 4D shows a state in which the imprint material 20 is irradiated with light and cured in a state in which the imprint material 20 on the substrate is in contact with the mold 11, and the mold 11 is separated from the cured imprint material 20. Referring to FIG. 4D, the mold-side mark 18 is transferred to the imprint material 20 on the substrate, and a transfer mark 21 of the imprint material 20 is thus formed on the substrate. When the relative position between the transfer mark 21 formed on the substrate and the substrate-side mark 19 is measured, so-called overlay inspection can be performed.

As described above, if an imprint material having high volatility is used, a method of arranging the imprint material on a substrate immediately before pressing is used. In this case, however, the substrate 13 needs to be moved to the position of the dispenser (supply unit 17) for every shot region of the substrate 13, and the productivity lowers. In recent years, a technique of, using an imprint material having a low volatility, arranging the imprint material all at once on the whole region (all shot regions) of the substrate 13 in advance has been examined.

How the mold-side mark 18 provided on the mold 11 is transferred to an imprint material 20A on the substrate (the imprint material on the substrate-side mark 19) in a case in which the imprint material 20A having a low volatility is used will be described with reference to FIGS. 5A to 5D.

Figure 5A:
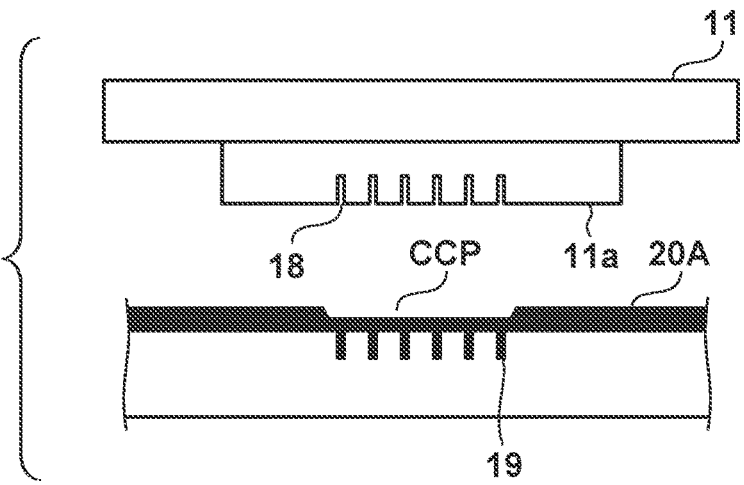
FIGS. 5A to 5D are views for describing imprint processing in detail.

FIG. 5A shows a state in which the imprint material 20A is arranged all at once on the whole region (all shot regions) of the substrate 13 in advance, and the substrate 13 is loaded into the imprint apparatus 1 and made to face the mold 11. The imprint material 20A is arranged on the whole region of the substrate 13 in advance using, for example, a spin coater. An unevenness is formed on the surface of the imprint material 20A because of the unevenness of the substrate 13 or the density of the pattern. In FIG. 5A, one large concave portion CCP is formed on the surface of the imprint material 20A on a portion where fine concave pattern elements that form the substrate-side mark 19 are concentrated. However, the unevenness is not limited to this. If a substrate has a large unevenness, an uneven structure is formed on the surface of the imprint material in conformity with the unevenness.

Figure 5B:
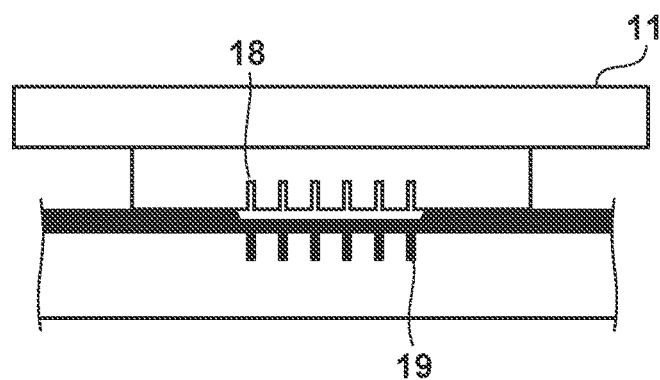
Figure 5C:
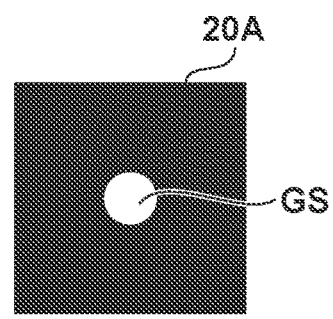

FIG. 5B shows a state in which the mold 11 (pattern surface 11a) is brought into contact with the imprint material 20A on the substrate with the concave portion CCP formed on the surface, and FIG. 5C shows the state in FIG. 5B viewed from above the substrate 13. As can be seen from FIGS. 5B and 5C, the gas GS existing between the mold 11 and the imprint material 20A on the substrate is captured in the concave portion CCP formed on the surface of the imprint material 20A. In addition, since the imprint material 20A is arranged in the whole region of the substrate 13 in advance, as shown in FIG. 5C, there is no path for releasing the gas GS captured in the concave portion CCP to the outside, and the gas GS is enclosed between the mold 11 and the substrate 13 (imprint material 20A). The volume of the gas GS captured in the concave portion CCP decreases when the gas GS is dissolved in a thin film or the imprint material 20A formed on the substrate and compressed by the mold 11. It takes a long time to fill the pattern of the mold 11 with the imprint material 20A.

In parallel to filling of the imprint material 20A into the pattern of the mold 11, in general, alignment between the mold 11 and the substrate 13 using the mold-side mark 18 and the substrate-side mark 19 is executed. In this case, because of the imprint material 20A halfway through filling into the mold-side mark 18 or insufficient filling of the imprint material 20A in the mold-side mark 18, an error may be included in a mark signal obtained by detecting the mold-side mark 18. Although the alignment between the mold 11 and the substrate 13 may be executed after completion of filling of the imprint material 20A into the mold-side mark 18, this leads to lowing of the productivity of the imprint apparatus 1.

Figure 5D:
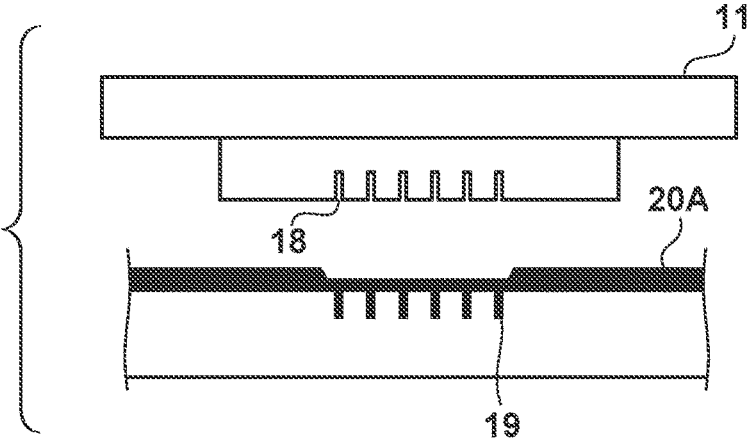

FIG. 5D shows a state in which the imprint material 20A is irradiated with light and cured in a state in which the imprint material 20A on the substrate is in contact with the mold 11, and the mold 11 is separated from the cured imprint material 20A. Referring to FIG. 5D, because of the gas GS captured in the concave portion CCP formed on the surface of the imprint material 20A, the mold-side mark 18 is not sufficiently filled with the imprint material 20A. In such a case, the mold-side mark 18 is not transferred to the imprint material 20A, and a portion where the transfer mark of the imprint material 20A corresponding to the mold-side mark 18 is not formed is generated on the substrate. Also, even in a region where the mold-side mark 18 or the pattern of the mold 11 does not exist, a region where the thickness (remaining film thickness) of the film of the imprint material 20A is less than in the remaining region is formed on the substrate because of the gas GS captured in the concave portion CCP formed on the surface of the imprint material 20A. Hence, for example, when performing etching for the substrate 13 as shown in FIG. 5D in a following step, an unevenness in the substrate may occur due to the difference in the remaining film thickness of the imprint material 20A on the substrate.

As described above, if the imprint material 20A is arranged all at once on the whole region of the substrate 13 in advance, and an unevenness is formed on the surface of the imprint material 20A on the substrate, this impedes filling of the imprint material 20A into the pattern of the mold 11.

Figure 7A:
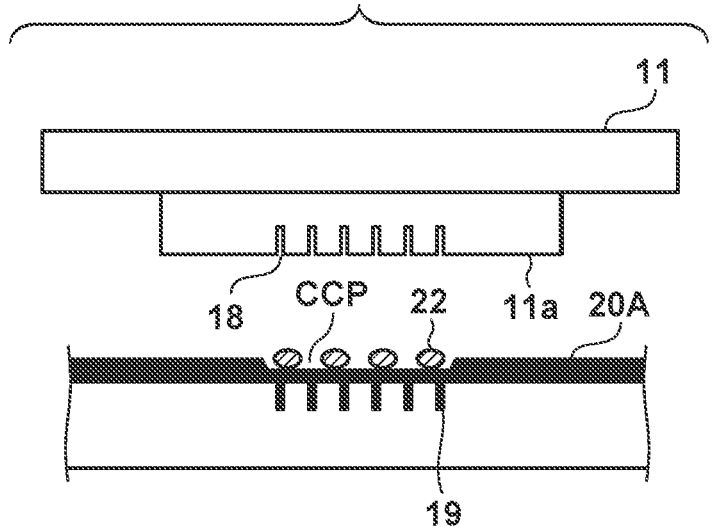
FIGS. 7A to 7C are views for describing imprint processing according to the embodiment in detail.
Figure 7B:
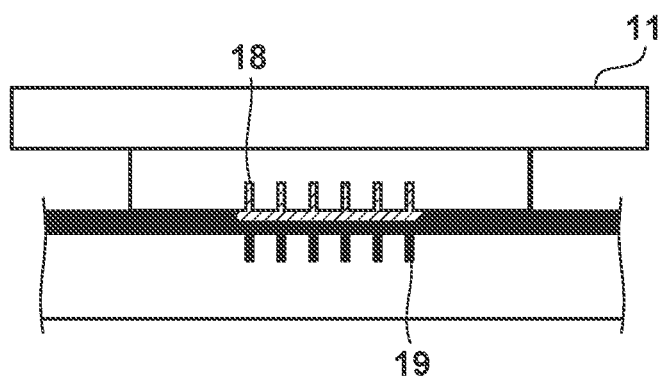
Figure 7C:
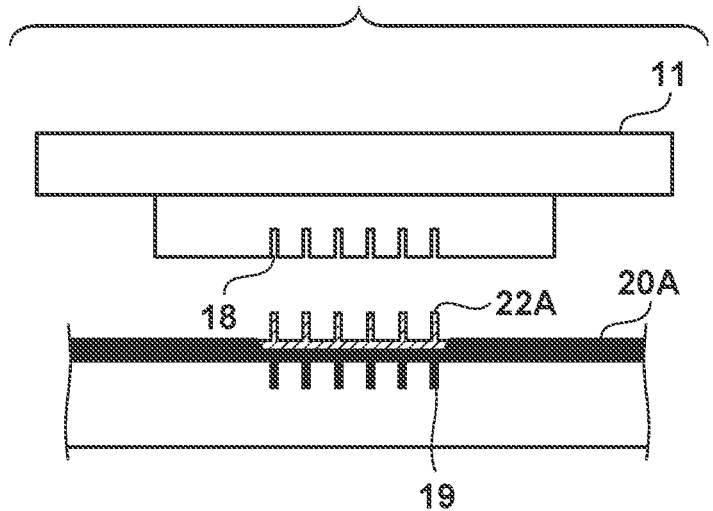

In this embodiment, there is provided a technique (imprint method) for improving the above-described problem. Imprint processing (molding method) to be performed using the imprint apparatus 1 will be described with reference to FIGS. 6 and 7A to 7C. Such imprint processing is performed when the control unit CU comprehensively controls the units of the imprint apparatus 1, as described above. FIG. 6 is a flowchart for describing an imprint method according to this embodiment. FIGS. 7A to 7C show how the mold-side mark 18 provided on the mold 11 is transferred to the imprint material 20A on the substrate (the imprint material on the substrate-side mark 19) in the imprint method according to this embodiment.

Referring to FIG. 6, in step S602, the imprint material 20A (an uncured imprint material (first composition) having a low volatility) is arranged on the surface of the substrate 13, in this embodiment, on the whole region of the substrate 13. Here, the imprint material 20A is arranged on the substrate as a film that continuously covers the whole region of the substrate 13. More specifically, from the viewpoint of time required to arrange the imprint material 20A or film thickness control of the imprint material 20A, the imprint material 20A is arranged all at once on the whole region of the substrate 13 in advance using a spin coater.

In step S604, the substrate 13 on which the imprint material 20A is arranged in step S602 is loaded into the imprint apparatus 1. As described above, if the imprint material 20A is arranged all at once on the whole region of the substrate 13 in advance, an unevenness is formed on the surface of the imprint material 20A on the substrate in accordance with an unevenness (a pattern or a mark) on the surface of the substrate 13.

In step S606 (first step), unevenness information concerning the unevenness of the surface of the imprint material 20A arranged all at once on the whole region of the substrate 13 in advance is obtained. The unevenness information includes information representing the position, depth, height, and the like of an unevenness existing on the surface of the imprint material 20A. The unevenness information can be obtained by, for example, measuring the unevenness (height) of the surface of the imprint material 20A on the substrate.

Figure 8:
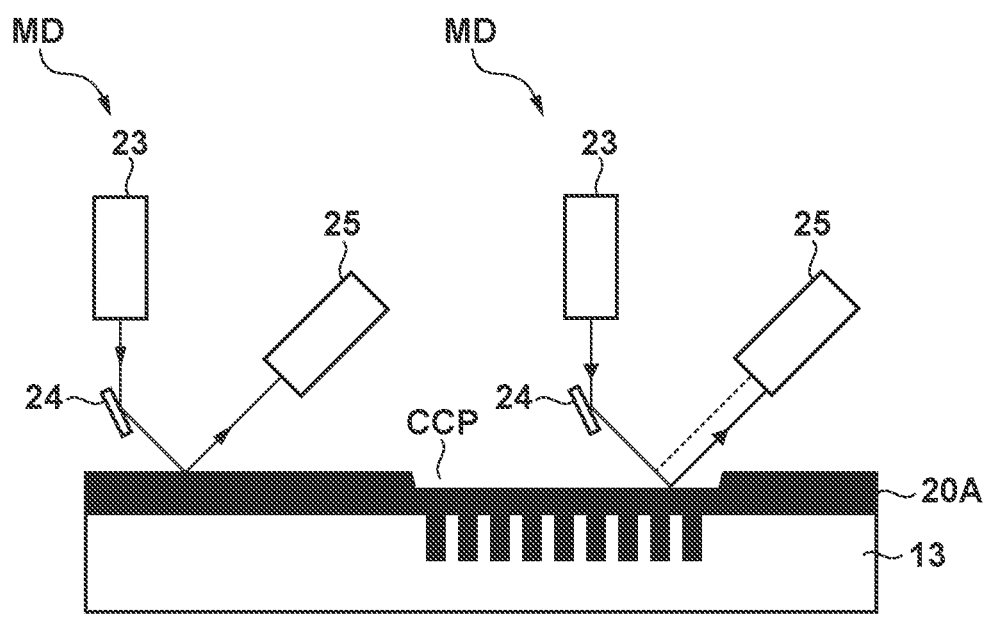
FIG. 8 is a view for describing a method of measuring an unevenness of the surface of an imprint material on a substrate.

FIG. 8 is a view for describing a method of measuring the unevenness of the surface of the imprint material 20A on the substrate. Referring to FIG. 8, the concave portion CCP is formed on the surface of the imprint material 20A on the substrate due to the substrate-side mark 19 provided on the substrate 13. To measure the unevenness of the surface of the imprint material 20A, for example, a measuring device having a configuration similar to that of a focus sensor, more specifically, a measuring device MD including a light source 23, an optical element 24, and a sensor 25 is used. Light from the light source 23 obliquely enters the surface (measurement point) of the imprint material 20A via the optical element 24. The light regularly reflected by the surface of the imprint material 20A enters the sensor 25 and forms an image on the sensor. Here, if the height of the surface of the imprint material 20A that the light from the light source 23 enters changes, the image formation position, on the sensor 25, of the light regularly reflected by the surface of the imprint material 20A changes because the imprint material 20A is irradiated with the light by oblique incidence. Hence, when the relationship between the change amount of the image formation position and the height of the surface of the imprint material 20A is obtained in advance, the height (unevenness) of the surface of the imprint material 20A can be grasped (measured). In addition, when the measurement result and the position of the sensor 25 or the position of the substrate stage are associated, the position on the imprint material 20A where the concave portion CCP (uneven structure) exists can also be grasped.

Note that the method of measuring the unevenness of the surface of the imprint material 20A on the substrate is not limited to the method shown in FIG. 8. For example, the unevenness of the surface of the imprint material 20A on the substrate may be grasped by obtaining an in-focus position from image contrast using a confocal microscope. Alternatively, the imprint material 20A on the substrate may be irradiated with light, and the unevenness of the surface of the imprint material 20A may be grasped from the position or intensity of scattered light scattered on the surface of the imprint material 20A. Also, a probe-type height measurement method using an AFM (Atomic Force Microscope) or the like may be used. However, if there is a fear to contaminate the substrate 13, a noncontact height measurement method is preferably used. If contamination of the substrate 13 is not problematic (for example, if a substrate not to be used later is sampled and inspected), the probe-type height measurement method is also useful.

In addition, the mold-side mark 18 provided on the mold 11 is detected (observed) by the measuring unit 15 even it is being filled with the imprint material 20A. Hence, the unevenness of the surface of the imprint material 20A may be obtained based on the degree of filling of the imprint material 20A in the mold-side mark 18. For example, because of scattering of light, the boundary between the region where the gas GS exists and the region where the imprint material 20A strongly shines in some cases. Also, the region where the gas GS exists strongly shines in some cases because of a large refractive index difference with respect to the mold-side mark 18. The unevenness of the surface of the imprint material 20A can be obtained from such a phenomenon.

The unevenness, more particularly, the concave portion CCP formed on the surface of the imprint material 20A typically appears in correspondence with the unevenness of the surface of the substrate 13, as described above. Hence, the unevenness information concerning the unevenness of the surface of the imprint material 20A may be obtained by predicting the unevenness to be formed on the surface of the imprint material 20A based on the design information of the position of a pattern (underlying pattern) or a mark (substrate-side mark 19) provided on the substrate 13.

The unevenness information concerning the unevenness of the surface of the imprint material 20A may be obtained from the observation result of the imprint material 20A (cured product) on the substrate that has undergone imprint processing before the substrate 13 (the substrate as the current processing target) to be processed by imprint processing. More specifically, the transfer pattern transferred to the imprint material 20A on the substrate is observed, and it is confirmed whether the transfer pattern is correctly formed, thereby estimating the unevenness formed on the surface of the imprint material 20A and obtaining unevenness information. In particular, if it is a transfer pattern transferred by imprint processing using the same mold 11 and the same substrate 13, unevenness information with high reproducibility can be obtained.

In step S608 (fourth step), (the position of) the concave portion CCP of the surface of the imprint material 20A on the substrate is specified based on the unevenness information obtained in step S606. At this time, the amount of droplets of the imprint material to be arranged on the concave portion CCP of the surface of the imprint material 20A, that is, the amount (shortage amount) of droplets of the imprint material necessary for filling the concave portion CCP may further be specified based on the unevenness information obtained in step S606.

In step S610 (second step), as shown in FIG. 7A, droplets of an imprint material 22 (uncured imprint material (second composition)) are arranged (added) on the concave portion CCP of the surface of the imprint material 20A on the substrate based on the unevenness information obtained in step S606. For example, the droplets of the imprint material 22 are arranged, in the amount specified in step S608, on the concave portion CCP of the surface of the imprint material 20A specified in step S608. More specifically, the droplets of the imprint material 22 are arranged on the concave portion CCP of the surface of the imprint material 20A on the substrate using the supply unit 17 (dispenser) provided in the imprint apparatus 1.

The imprint material 22 to be arranged as droplets on the concave portion CCP of the surface of the imprint material 20A on the substrate will be described here. The imprint material 22 is preferably an imprint material of the same type (characteristic) as the imprint material 20A. Particularly, concerning the pattern of an actual element, etching is performed in the following step (next step). If an imprint material of a different type is arranged, the etching condition changes, and a defect may occur. However, if the difference does not pose a problem in the following step, the imprint material 22 may be an imprint material of a type different from the imprint material 20A. Also, as for the mark, for example, the substrate-side mark 19 to be used for alignment of the substrate 13, since the mark is not used in the following step, a serious problem does not arise even if the etching condition is different. Hence, concerning the mark to be used for alignment of the substrate 13, since the restriction in the following step is small as compared to the actual element, an imprint material having a viscosity lower than the viscosity of the imprint material 20A may be used as the imprint material 22 to implement high-speed filling. However, if the interface between the imprint material 20A and the imprint material 22 is peeled when separating the mold 11 from the cured imprint material on the substrate, a waste occurs. Hence, an imprint material that to be sufficiently polymerized with the imprint material 20A needs to be selected as the imprint material 22. If there is no resistant to such peeling, a material for increasing the resistance may be arranged on the interface between the imprint material 20A and the imprint material 22. Note that although the imprint material 22 may be the same as the imprint material 20A, as described above, FIG. 7A discriminately shows the imprint material 20A and the imprint material 22.

In step S612 (third step), the mold 11 is brought into contact with the imprint materials 20A and 22 on the substrate, as shown in FIG. 7B. The pattern of the mold 11 is thus filled with the imprint materials 20A and 22 on the substrate. In other words, an imprint material including the film of the imprint material 20A and the droplets of the imprint material 22 on the substrate is molded by the mold 11. Referring to FIG. 7B, since the droplets of the imprint material 22 are arranged (added) on the concave portion CCP of the imprint material 20A, the gas GS captured in the concave portion CCP decreases, and filling of the imprint materials 20A and 22 into the pattern of the mold 11 is promoted. As described above, in this embodiment, when the droplets of the imprint material 22 are arranged on the concave portion CCP of the imprint material 20A, the influence of the gas GS captured in the concave portion CCP, that is, impediment to filling of the imprint material 20A into the pattern of the mold 11 can be suppressed.

In step S614, in the state in which the mold 11 and the imprint materials 20A and 22 on the substrate are in contact, the imprint materials 20A and 22 are irradiated with light and cured.

In step S616, as shown in FIG. 7C, the mold 11 is separated from the cured imprint materials 20A and 22 on the substrate. As shown in FIG. 7B, in this embodiment, the mold-side mark 18 is sufficiently filled with the imprint material 22 (and the imprint material 20A). Hence, as shown in FIG. 7C, the mold-side mark 18 is transferred to the imprint material 22 (and the imprint material 20A), and a transfer mark 22A of the imprint material 22 corresponding to the mold-side mark 18 is formed on the substrate. In addition, since the imprint material 20A and the imprint material 22 are polymerized, the interface between the imprint material 20A and the imprint material 22 is not peeled even when the mold 11 is separated.

In step S618, the substrate 13 that has undergone the imprint processing is unloaded from the imprint apparatus 1. The substrate 13 unloaded from the imprint apparatus 1 is sent to the following step (next step).

As described above, according to the imprint processing of this embodiment, it is possible to suppress impediment to filling of the imprint material 20A into the pattern of the mold 11, which is caused by the gas GS captured in the concave portion CCP of the surface of the imprint material 20A on the substrate, and maintain (improve) the productivity.

Note that in step S610, the position to arrange (add) the droplets of the imprint material 22 is preferably limited only to the concave portion CCP of the surface of the imprint material 20A on the substrate. For example, if the droplets of the imprint material 22 are arranged on a flat portion or a convex portion of the surface of the imprint material 20A, a more noticeable uneven structure is formed on the surface of the imprint material 20A. If a fine uneven structure is formed, the uneven structure is evened (that is, flattened) when the mold 11 is brought into contact with the imprint materials 20A and 22, and no large change occurs. On the other hand, if a large uneven structure is formed, the mold 11 may locally deform in a direction orthogonal to the pattern surface 11a when the mold 11 is brought into contact with the imprint materials 20A and 22. It is considered that this distorts the mold 11 (pattern surface 11a) and results in lowering of the overlay accuracy.

The timing of arranging the droplets of the imprint material 22 on the concave portion CCP of the surface of the imprint material 20A on the substrate depends on the apparatus configuration or the characteristic of the imprint material 22. If an imprint material having a high volatility is used as the imprint material 22, the droplets of the imprint material 22 need to be arranged for each shot region of the substrate 13. In this case, however, since the step of arranging the droplets of the imprint material 22 on the concave portion CCP of the surface of the imprint material 20A on the substrate is performed for each shot region of the substrate 13, the productivity may be lowered greatly. Hence, an imprint material having a low volatility is used as the imprint material 22, and the droplets of the imprint material 22 are arranged at the same timing (all at once) on necessary portions (all concave portions CCP of the surface of the imprint material 20A) of the whole region of the substrate 13.

Note that in this embodiment, a case in which the substrate holding unit 14 (substrate stage) is caused to hold the substrate 13 on which the imprint material 20A is arranged, and the supply unit 17 arranges the droplets of the imprint material 22 has been described. Hence, a new component such as a stage is unnecessary, but contact between the mold 11 and the imprint materials 20A and 22 (step S612) cannot be started until the arrangement of the droplets of the imprint material 22 by the supply unit 17 (step S610) is completed.

Figure 9:
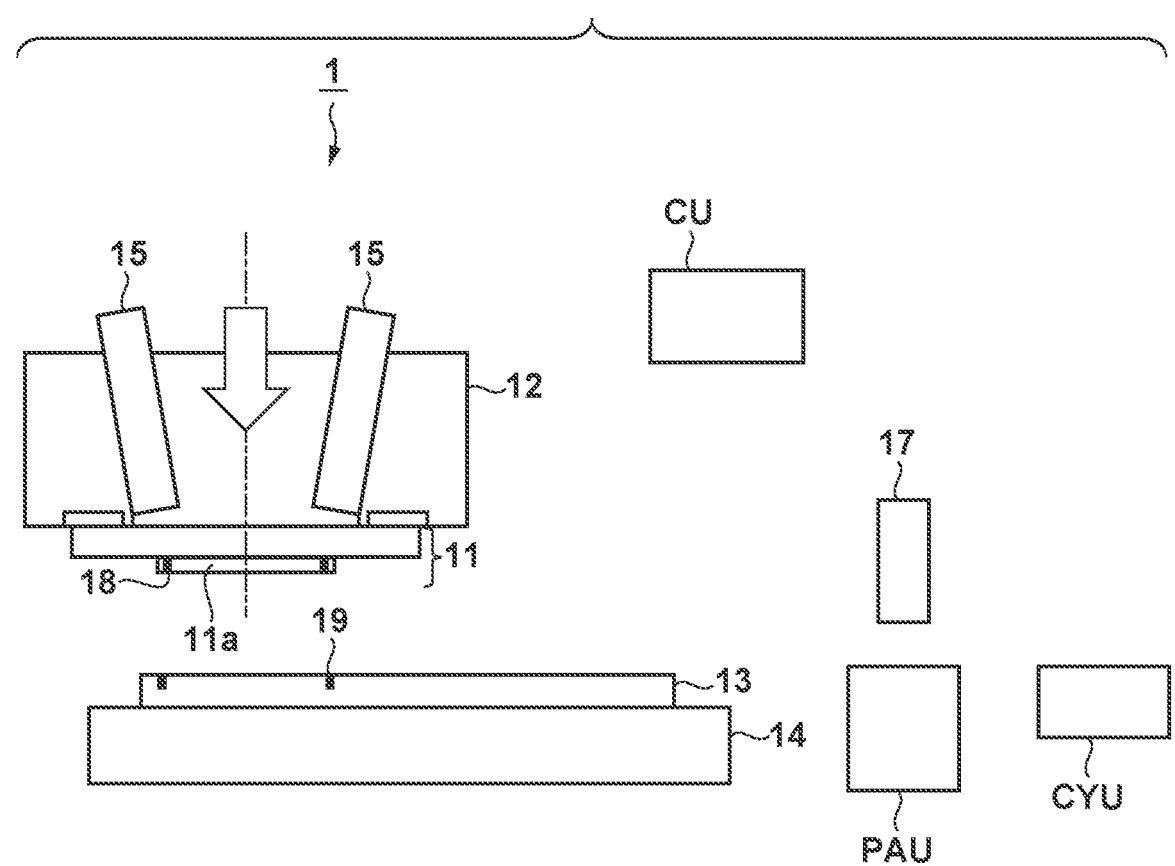
FIG. 9 is a schematic view illustrating configurations of an imprint apparatus according to an aspect of the present invention.

It is preferable that an area to arrange the droplets of the imprint material 22 on the concave portion CCP of the surface of the imprint material 20A on the substrate is provided before the area to perform the step of bringing the mold 11 into contact with the imprint materials 20A and 22. This makes it possible to perform parts of the arrangement of the droplets of the imprint material 22 (step S610) and the contact between the mold 11 and the imprint materials 20A and 22 (step S612) in parallel for substrates different from each other. More specifically, as shown in FIG. 9, the supply unit 17 (dispenser) is provided in at least one of a prealignment unit PAU and a conveyance unit CYU to form the area to arrange the droplets of the imprint material 22 on the concave portion CCP of the surface of the imprint material 20A on the substrate. The substrate holding unit may be driven or the supply unit 17 may be driven to apply the imprint material to the whole surface of the substrate. Here, the prealignment unit PAU is a unit configured to perform prealignment for the substrate 13, and the conveyance unit CYU is a unit configured to convey the substrate 13 to the prealignment unit PAU. By adding minimum functions to the imprint apparatus 1, parts of the arrangement of the droplets of the imprint material 22 (step S610) and the contact between the mold 11 and the imprint materials 20A and 22 (step S612) can be performed in parallel. It is therefore possible to improve the productivity without making the imprint apparatus 1 bulky. Note that although the supply unit 17 is provided here in at least one of the prealignment unit PAU and the conveyance unit CYU, the present invention is not limited to this. For example, the supply unit 17 may be provided in a temperature adjustment unit that adjusts the temperature of the substrate 13 before the substrate holding unit 14 is caused to hold the substrate 13. If it is difficult to obtain sufficient performance by adding the functions, a unit configured to add an imprint material may additionally be constituted.

Figure 10:
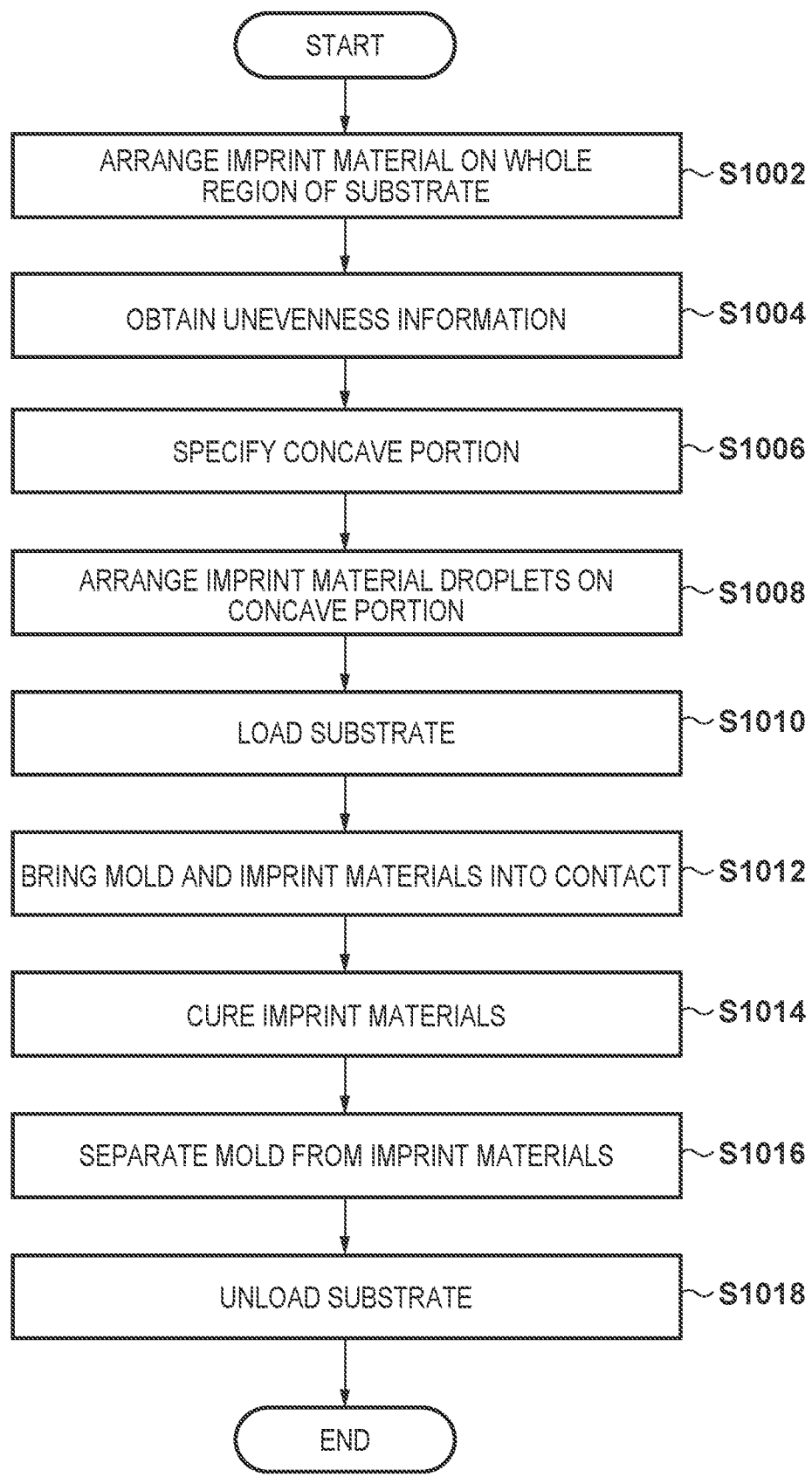
FIG. 10 is a flowchart for describing imprint processing according to the embodiment.

The step (step S610) of arranging the droplets of the imprint material 22 on the concave portion CCP of the surface of the imprint material 20A on the substrate may be performed not after the substrate 13 is loaded into the imprint apparatus 1 but before the substrate 13 is loaded into the imprint apparatus 1, as shown in FIG. 10.

Referring to FIG. 10, in step S1002, the imprint material 20A is arranged on the surface of the substrate 13, in this embodiment, on the whole region of the substrate 13, as in step S602. In step S1004, unevenness information concerning the unevenness of the surface of the imprint material 20A arranged all at once on the whole region of the substrate 13 in advance is obtained, as in step S606. In step S1006, (the position of) the concave portion CCP of the surface of the imprint material 20A on the substrate is specified based on the unevenness information obtained in step S1004, as in step S608.

In step S1008, the droplets of the imprint material 22 are arranged (added) on the concave portion CCP of the surface of the imprint material 20A on the substrate based on the unevenness information obtained in step S1004, as in step S610. In this case, the dispenser configured to arrange the droplets of the imprint material 22 on the substrate, more specifically, on the concave portion CCP of the surface of the imprint material 20A on the substrate and the substrate stage that holds the substrate 13 need to be provided outside the imprint apparatus 1. To arrange the droplets of the imprint material 22 at a predetermined position on the substrate, more specifically, on the concave portion CCP of the surface of the imprint material 20A on the substrate, one of the dispenser and the substrate stage is configured to be movable.

In step S1010, the substrate 13 on which the imprint materials 20A and 22 are arranged is loaded into the imprint apparatus 1. Steps S1012 to S1018 are the same as steps S612 to S608, and a detailed description thereof will be omitted here.

As described above, even if the droplets of the imprint material 22 are arranged on the concave portion CCP of the surface of the imprint material 20A on the substrate before the substrate 13 is loaded into the imprint apparatus 1, the same effects as described with reference to FIG. 6 can be obtained.

Figure 11:
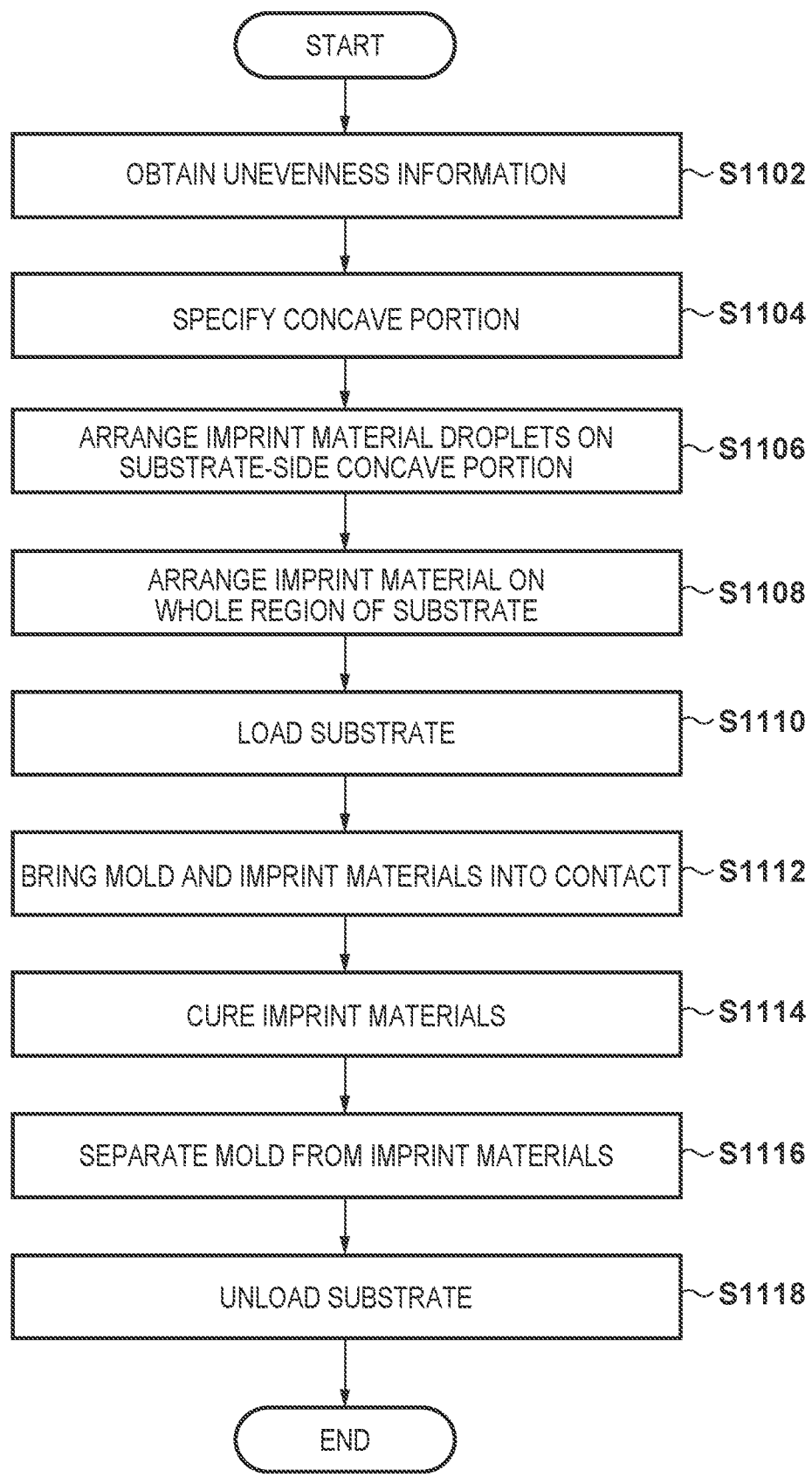
FIG. 11 is a flowchart for describing imprint processing according to the embodiment.

Also, as shown in FIG. 11, the order of the step (step S602) of arranging the imprint material 20A on the whole region of the substrate 13 and the step (step S610) of arranging the droplets of the imprint material 22 on the concave portion CCP of the surface of the imprint material 20A on the substrate may be changed.

Referring to FIG. 11, in step S1102, unevenness information concerning the unevenness of the surface of the imprint material 20A arranged all at once on the whole region of the substrate 13 in advance is obtained. At this time, since the imprint material 20A is not arranged on the substrate yet, the unevenness of the surface of the imprint material 20A cannot be measured. Hence, as described above, the unevenness of the surface of the imprint material 20A is predicted from the design information of the position of a pattern or a mark provided on the substrate 13. Alternatively, the unevenness information concerning the unevenness of the surface of the imprint material 20A may be obtained from an observation result of the imprint material 20A on the substrate that has undergone imprint processing.

In step S1104, (the position of) the concave portion CCP of the surface of the imprint material 20A arranged on the substrate is specified based on the unevenness information obtained in step S1102. In step S1106, the droplets of the imprint material 22 are arranged on a concave portion (substrate-side concave portion) on the substrate corresponding to the concave portion CCP specified in step S1104.

In step S1108, the imprint material 20A is arranged on the whole region of the substrate 13 on which the droplets of the imprint material 22 are arranged. At this time, since the droplets of the imprint material 22 are already arranged on the substrate-side concave portion, the portion that becomes a concave portion after the arrangement of the imprint material 20A is reduced, and a flat surface can be obtained on the imprint material including the imprint materials 20A and 22. A spin coater is used to arrange the imprint material 20A on the whole region of the substrate 13. If the droplets of the imprint material 22 remain uncured (liquid), the droplets of the imprint material 22 arranged on the substrate-side concave portion may move. In this case, before the imprint material 20A is arranged on the whole region of the substrate 13, the droplets of the imprint material 22 arranged on the substrate-side concave portion may be irradiated with light and cured. In this case, a unit (for example, a UV lamp or an LED) that emits light to cure the droplets of the imprint material 22 on the substrate needs to be provided outside the imprint apparatus 1. When the droplets of the imprint material 22 on the substrate are cured, it is possible to prevent the droplets of the imprint material 22 from moving from the substrate-side concave portion even if a spin coater is used to arrange the imprint material 20A on the whole region of the substrate 13.

In step S1110, the substrate 13 on which the imprint materials 20A and 22 are arranged is loaded into the imprint apparatus 1. Steps S1112 to S1118 are the same as steps S612 to S608, and a detailed description thereof will be omitted here.

As described above, even if the order of the step of arranging the imprint material 20A and the step of arranging the droplets of the imprint material 22 is changed, the same effects as described with reference to FIG. 6 can be obtained.

As a configuration for implementing the imprint method shown in FIG. 11, an imprint system (molding system) including a spin coater, the imprint apparatus 1, and a dispenser that arranges the droplets of the uncured imprint material 22 on the substrate 13 also constitutes one aspect of the present invention. Here, the spin coater is a device that arranges the uncured imprint material 20A on the substrate as a film continuously covering the surface of the substrate 13, as described above.

An imprint method (molding method) that does not include the step (step S606) of obtaining unevenness information concerning the unevenness of the surface of the imprint material 20A arranged all at once on the whole region of the substrate 13 in advance also constitutes one aspect of the present invention. More specifically, this imprint method includes a step of arranging the droplets of the uncured imprint material 22 in a region where the concave portion CCP is to be formed on the surface of the uncured imprint material 20A arranged on the substrate. At this time, in the substrate 13, a region where a mark used for alignment of the substrate 13, that is, the substrate-side mark 19 is provided is set to the region where the concave portion CCP is to be formed on the surface of the imprint material 20A on the substrate.

The pattern of a cured product formed using the imprint apparatus 1 (the imprint method according the present invention) is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 12A:
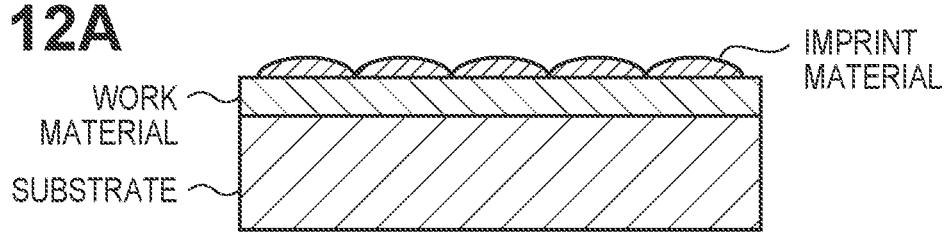
FIGS. 12A to 12F are views for describing an article manufacturing method.

A detailed article manufacturing method will be described next. As shown in FIG. 12A, a substrate such as a silicon wafer with a work material such as an insulator formed on the surface is prepared, and an imprint material is applied to the surface of the work material by a spin coater or the like. A state in which the imprint material formed as a film continuously covering the surface of the substrate is applied onto the substrate is shown here. Also, as described above, the droplets of an uncured imprint material are applied to a concave portion formed on the surface of (the film of) the imprint material applied onto the substrate, thereby obtaining the film of the imprint material with a flat surface.

Figure 12B:
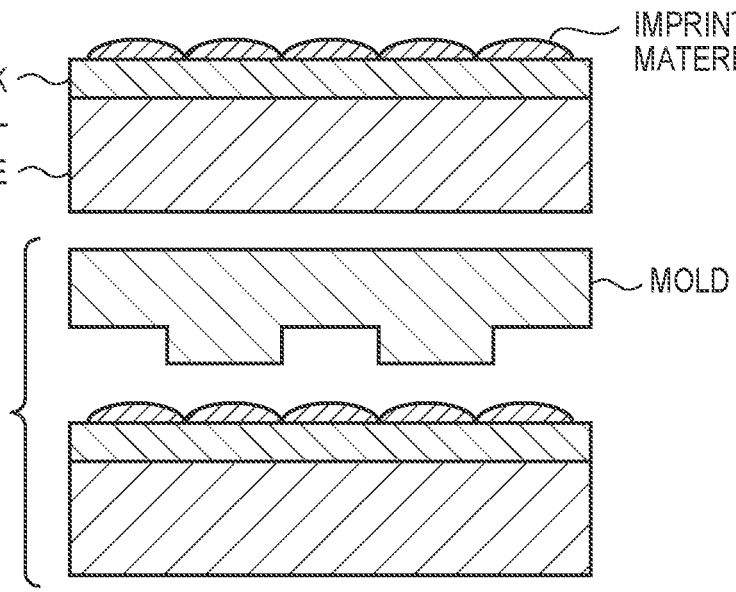
Figure 12C:
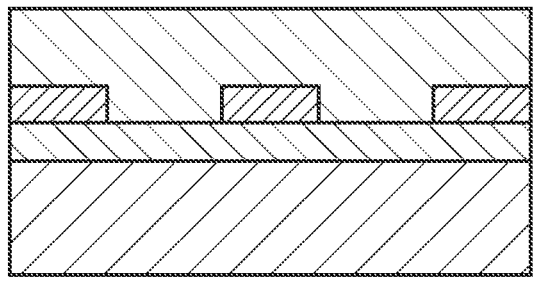

As shown in FIG. 12B, a side of the mold for imprint with a projection and groove pattern is formed on and caused to face the imprint material on the substrate. As illustrated in FIG. 12C, the substrate to which the imprint material is applied is brought into contact with the mold, and a pressure is applied. The gap between the mold and the work material is filled with the imprint material. In this state, when the imprint material is irradiated with light serving as curing energy through the mold, the imprint material is cured.

Figure 12D:
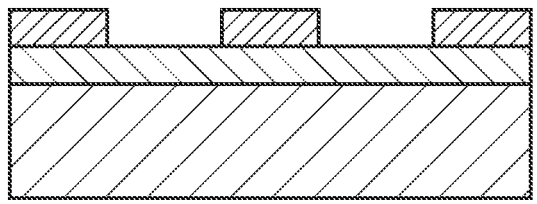

As shown in FIG. 12D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold $4z$ is transferred to the imprint material.

Figure 12E:
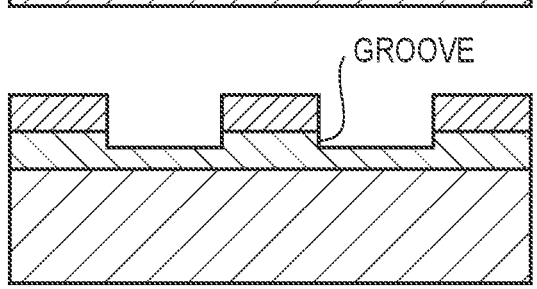
Figure 12F:
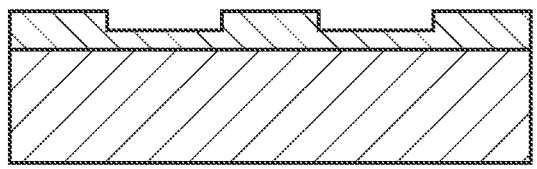

As shown in FIG. 12E, when etching is performed using the pattern of the cured product as an etching resistant mask, a portion of the surface of the work material where the cured product does not exist or remains thin is removed to form a groove. As shown in FIG. 12F, when the pattern of the cured product is removed, an article with the grooves formed in the surface of the work material can be obtained. The pattern of the cured material is removed here, but, for example, the pattern may be used as a film for insulation between layers included in a semiconductor element or the like without being removed after processing, in other words as a constituent member of the article.

Note that in this embodiment, a circuit pattern transfer mold on which an uneven pattern is formed has been described as the mold 11. The mold 11 may be a mold (plane template) having a plane portion where no uneven pattern is formed. The plane template is used in a planarization apparatus (molding apparatus) that performs planarization processing (molding processing) of performing molding such that a composition on a substrate is planarized by the plane portion. The planarization processing includes a step of curing a curable composition by light irradiation or heating in a state in which the plane portion of the plane template is in contact with the curable composition supplied onto the substrate. As described above, this embodiment can be applied to a molding apparatus configured to mold a composition on a substrate using a plane template.

Figure 13A:
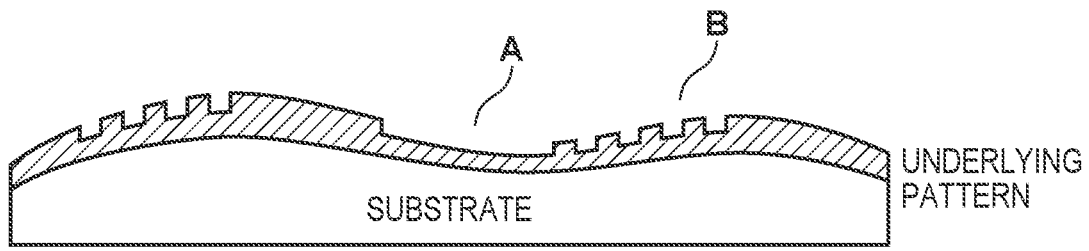
FIGS. 13A to 13D are views for describing a case in which the imprint apparatus shown in FIG. 1 is used as a planarization apparatus.

The underlying pattern on the substrate has an uneven profile derived from the pattern formed in the previous step. In particular, with the recent multilayered structure of a memory element, the substrate (process wafer) may have a step of about 100 nm. The step derived from a moderate undulation of the entire substrate can be corrected by the focus following function of an exposure apparatus (scanner) used in the photolithography step. However, an unevenness with a small pitch fitted in the exposure slit area of the exposure apparatus directly consumes the DOF (Depth Of Focus) of the exposure apparatus. As a conventional technique of planarizing the underlying pattern of a substrate, a technique of forming a planarization layer, such as SOC (Spin On Carbon) or CMP (Chemical Mechanical Polishing), is used. In the conventional technique, however, as shown in FIG. 13A, an unevenness suppressing rate of only 40% to 70% is obtained in the boundary portion between an isolated pattern region A and a repetitive dense (concentration of a line & space pattern) pattern region B, and sufficient planarization performance cannot be obtained. The unevenness difference of the underlying pattern caused by the multilayered structure tends to further increase in the future.

As a solution to this problem, U.S. Pat. No. 9,415,418 proposes a technique of forming a continuous film by application of a resist serving as a planarization layer by an inkjet dispenser and pressing by a plane template. Also, U.S. Pat. No. 8,394,282 proposes a technique of reflecting a topography measurement result on a substrate side on density information for each position to instruct application by an inkjet dispenser. An imprint apparatus IMP can particularly be applied as a planarization processing (planarization) apparatus for performing local planarization in a substrate surface by pressing not the mold 11 but a plane template against an uncured resist applied in advance.

FIG. 13A shows a substrate before planarization processing. In the isolated pattern region A, the area of a pattern convex portion is small. In the repetitive dense pattern region B, the ratio of the area of a pattern convex portion to the area of a pattern concave portion is 1:1. The average height of the isolated pattern region A and the repetitive dense pattern region B changes depending on the ratio of the pattern convex portion.

Figure 13B:
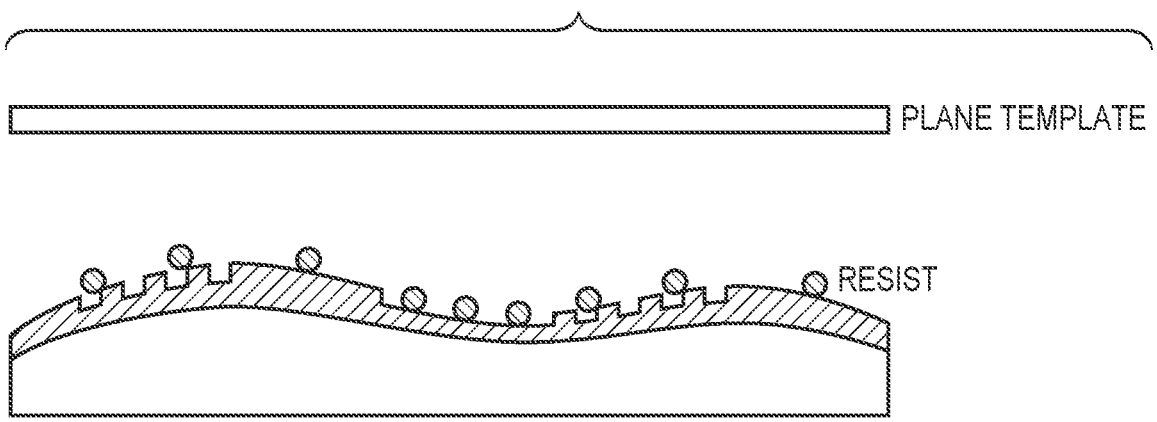

FIG. 13B shows a state in which the resist that forms the planarization layer is applied to the substrate. FIG. 13B shows a state in which the resist is applied by an inkjet dispenser based on the technique proposed in U.S. Pat. No. 9,415,418. However, a spin coater may be used to apply the resist. In other words, the imprint apparatus IMP can be applied if a step of pressing a plane template against an uncured resist applied in advance to planarize the resist is included.

Figure 13C:
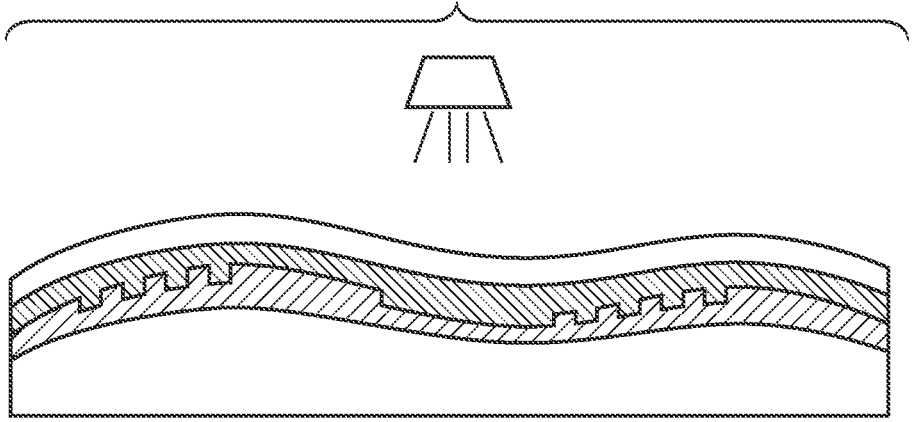
Figure 13D:
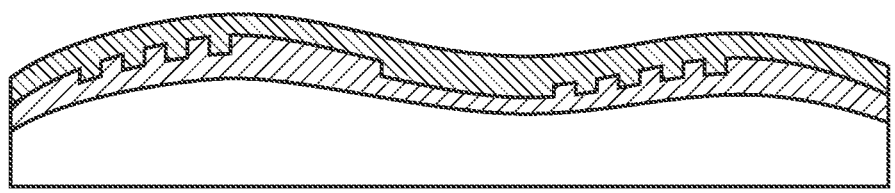

As shown in FIG. 13C, the plane template is made of glass or quartz that passes UV rays, and the resist is cured by irradiation of UV rays from a light source. For the moderate unevenness of the entire substrate, the plane template conforms to the profile of the substrate surface. After the resist is cured, the plane template is separated from the resist, as shown in FIG. 13D.

The present invention is not limited to the above embodiments and various changes and modifications can be made within the spirit and scope of the present invention. Therefore, to apprise the public of the scope of the present invention, the following claims are made.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2020-180839 filed on Oct. 28, 2020, which is hereby incorporated by reference herein in its entirety.

What is claimed is:

1. A molding method of molding, using a mold, an uncured composition arranged on a substrate as a film continuously covering a surface of the substrate, comprising:
   obtaining unevenness information concerning an unevenness of a surface of an uncured first composition arranged as the film on the substrate;
   arranging a droplet of an uncured second composition on a concave portion of the surface of the first composition based on the unevenness information obtained in the obtaining; and
   after the arranging the droplet is performed, molding a composition including the film of the first composition and the droplet of the second composition by the mold.

2. The method according to claim 1, wherein in the obtaining, the unevenness information is obtained by measuring the unevenness of the surface of the first composition arranged as the film on the substrate.

3. The method according to claim 1, wherein in the obtaining, the unevenness information is obtained by predicting the unevenness formed on the surface of the first composition based on design information of positions of a pattern and a mark provided on the substrate.

4. The method according to claim 1, wherein in the obtaining, the unevenness information is obtained from an observation result of a composition on a substrate, which is molded by the mold before the substrate.

5. The method according to claim 1, further comprising specifying the concave portion of the surface of the first composition based on the unevenness information obtained in the obtaining,
   wherein in the arranging the droplet, the droplet of the second composition is arranged on the concave portion specified in the specifying.

6. The method according to claim 5, wherein
   in the specifying, an amount of the droplet of the second composition to be arranged on the concave portion of the surface of the first composition is specified based on the unevenness information obtained in the obtaining, and
   in the arranging the droplet, the droplet of the second composition is arranged on the concave portion in the amount specified in the specifying.

7. The method according to claim 1, further comprising:
   arranging the first composition as the film on the substrate; and
   after the arranging the first composition is performed, loading the substrate into a molding apparatus configured to perform the arranging the droplet and the molding,
   wherein after the loading is performed, the molding apparatus performs the arranging droplet and the molding for the substrate.

8. The method according to claim 1, further comprising:
   arranging the first composition as the film on the substrate; and
   after the arranging the first composition and the arranging the droplet are sequentially performed, loading the substrate into a molding apparatus configured to perform the molding,
   wherein after the loading is performed, the molding apparatus performs the molding for the substrate.

9. The method according to claim 1, further comprising:
   after the arranging the droplet is performed, arranging the first composition as the film on the substrate; and
   after the arranging the first composition is performed, loading the substrate into a molding apparatus configured to perform the molding,
   wherein after the loading is performed, the molding apparatus performs the molding for the substrate.

10. The method according to claim 1, wherein parts of the arranging the droplet and the molding are performed in parallel for substrates different from each other.

11. The method according to claim 1, wherein the second composition is a composition of the same type as the first composition.

12. The method according to claim 1, wherein the second composition is a composition having a viscosity lower than a viscosity of the first composition.

13. The method according to claim 1, wherein the surface of the substrate includes a plurality of shot regions.

14. The method according to claim 1, wherein
   the mold includes a pattern, and
   in the molding, the pattern of the mold is brought into contact with the composition including a layer of the first composition and the droplet of the second composition, thereby forming a pattern of the composition on the substrate.

15. The method according to claim 1, wherein
   the mold includes a plane portion, and
   in the molding, the plane portion of the mold is brought into contact with the composition including a layer of the first composition and the droplet of the second composition, thereby planarizing the composition on the substrate.

16. A molding method of molding, using a mold, an uncured composition arranged on a substrate as a film continuously covering a surface of the substrate, comprising:
  arranging a droplet of an uncured second composition in a region where a concave portion is to be formed on a surface of an uncured first composition arranged as the film on the substrate; and
  after the droplet of the second composition is arranged, molding a composition including the film of the first composition and the droplet of the second composition by the mold.

17. The method according to claim 16, wherein a region where a mark to be used for alignment of the substrate is provided on the substrate is set to the region where the concave portion is to be formed.

18. An article manufacturing method comprising:
  molding an uncured composition arranged on a substrate using a molding method defined in claim 1;
  processing the substrate on which the composition is molded in the molding; and
  manufacturing an article from the processed substrate.

19. A molding apparatus configured to mold, using a mold, an uncured composition arranged on a substrate as a film continuously covering a surface of the substrate, comprising:
  a prealignment unit configured to perform prealignment for the substrate on which the uncured first composition is arranged as the film;
  a conveyance unit configured to convey the substrate to the prealignment unit;
  a dispenser provided in at least one of the prealignment unit and the conveyance unit and configured to arrange a droplet of an uncured second composition on the substrate; and
  a control unit configured to obtain unevenness information concerning an unevenness of a surface of the first composition arranged on the substrate and control the dispenser based on the unevenness information such that the droplet of the uncured second composition is arranged on a concave portion of the surface of the uncured first composition.

20. A molding system comprising:
  an apparatus configured to arrange an uncured composition on a substrate as a film continuously covering a surface of the substrate;
  a molding apparatus configured to mold, using a mold, an uncured first composition arranged as the film on the substrate;
  a dispenser configured to arrange a droplet of an uncured second composition on the substrate; and
  a control unit configured to obtain unevenness information representing an unevenness of a surface of the first composition arranged on the substrate and control the dispenser based on the unevenness information such that the droplet of the uncured second composition is arranged on a concave portion of the surface of the uncured first composition.

* * * * *